United States Patent
Kauffmann et al.

(10) Patent No.: US 9,431,981 B2
(45) Date of Patent: *Aug. 30, 2016

(54) ATTENTION-BASED DYNAMIC AUDIO LEVEL ADJUSTMENT

(71) Applicant: Google Inc., Mountain View, CA (US)

(72) Inventors: Alejandro José Kauffmann, San Francisco, CA (US); Lee Brandon Keely, San Francisco, CA (US)

(73) Assignee: Google Inc., Mountain View, CA (US)

( * ) Notice: Subject to any disclaimer, the term of this patent is extended or adjusted under 35 U.S.C. 154(b) by 81 days.

This patent is subject to a terminal disclaimer.

(21) Appl. No.: 14/493,941

(22) Filed: Sep. 23, 2014

(65) Prior Publication Data

US 2015/0280670 A1    Oct. 1, 2015

Related U.S. Application Data

(63) Continuation of application No. 14/253,027, filed on Apr. 15, 2014, now Pat. No. 8,874,448.

(60) Provisional application No. 61/973,638, filed on Apr. 1, 2014.

(51) Int. Cl.

| | |
|---|---|
| *G10L 21/034* | (2013.01) |
| *H03G 3/20* | (2006.01) |
| *G10L 25/78* | (2013.01) |
| *H04M 1/60* | (2006.01) |
| *G10L 21/0316* | (2013.01) |
| *H03G 3/32* | (2006.01) |
| *H03G 3/30* | (2006.01) |
| *G10L 15/08* | (2006.01) |
| *G10L 25/21* | (2013.01) |
| *G10L 17/00* | (2013.01) |
| *G10L 21/0216* | (2013.01) |

(52) U.S. Cl.
CPC ............... *H03G 3/20* (2013.01); *G10L 21/034* (2013.01); *G10L 21/0316* (2013.01); *G10L 25/78* (2013.01); *H03G 3/3026* (2013.01); *H03G 3/32* (2013.01); *H04M 1/6016* (2013.01); *H04M 1/6058* (2013.01); *G10L 17/00* (2013.01); *G10L 25/21* (2013.01); *G10L 2015/088* (2013.01); *G10L 2021/02166* (2013.01); *H04M 2250/74* (2013.01)

(58) Field of Classification Search
USPC .......................... 704/275, 270; 381/104–107
See application file for complete search history.

(56) References Cited

U.S. PATENT DOCUMENTS

| 5,647,011 A | 7/1997 | Garvis |
| 7,706,551 B2 | 4/2010 | Falcon |

(Continued)

*Primary Examiner* — Abul Azad
(74) *Attorney, Agent, or Firm* — Shumaker & Sieffert, P.A.

(57) ABSTRACT

In one example, a technique may include outputting, by a computing device associated with a user and for playback at a first volume level by an audio output device, first audio data, receiving, by the computing device, audio input data, and responsive to determining, by the computing device, that the audio input data includes speech associated with an entity different from the user, determining, by the computing device and based at least in part on the audio input data, whether to output second audio data. The method may also include, responsive to determining to output the second audio data: determining, by the computing device, a second volume level lower than the first volume level, and outputting, by the computing device and for playback at the second volume level by the audio output device, the second audio data.

20 Claims, 5 Drawing Sheets

(56) References Cited

U.S. PATENT DOCUMENTS

| | | |
|---|---|---|
| 8,306,235 B2 | 11/2012 | Mahowald |
| 8,498,426 B2 | 7/2013 | Bonanno |
| 8,874,448 B1 * | 10/2014 | Kauffmann ............ G10L 25/78 381/107 |
| 2003/0138118 A1 * | 7/2003 | Stahl ....................... G10L 15/26 381/107 |
| 2004/0204168 A1 * | 10/2004 | Laurila ................... H04M 1/05 455/569.1 |
| 2004/0218768 A1 * | 11/2004 | Zhurin .................... H03G 3/32 381/107 |
| 2008/0147270 A1 | 6/2008 | Sakane et al. |
| 2009/0245533 A1 * | 10/2009 | Gerlach .............. H04M 1/6083 381/86 |
| 2010/0250253 A1 | 9/2010 | Shen |
| 2013/0094667 A1 | 4/2013 | Millington et al. |
| 2013/0279719 A1 * | 10/2013 | Lee ....................... H04M 1/605 381/107 |
| 2014/0090303 A1 | 4/2014 | Munson |

* cited by examiner

ATTENTION-BASED DYNAMIC AUDIO LEVEL ADJUSTMENT

This application is a continuation of U.S. application Ser. No. 14/253,027, filed Apr. 15, 2014, which claims the benefit of U.S. Provisional Application No. 61/973,638, filed Apr. 1, 2014, the entire contents of each of which are hereby incorporated by reference herein.

BACKGROUND

A user may wear headphones to listen to music or other audio in situations where a user can reasonably expect that a social interaction may occur, such as walking down the street, sitting on public transportation, or working in an office. However, headphones often make it difficult to hear ambient noise or other sounds other than the audio being output by the headphone. When a person other than the user is trying to get the user's attention, the person may be unable to do so without speaking unusually loudly, touching the user, or performing some other action that may not be socially acceptable. Even if the person is able to get the user's attention, the user may have to remove the headphones before the user is able to effectively interact with the person.

SUMMARY

In one example, a method may include outputting, by a computing device associated with a user and for playback at a first volume level by an audio output device, first audio data, receiving, by the computing device, audio input data, and responsive to determining, by the computing device, that the audio input data includes speech associated with an entity different from the user, determining, by the computing device and based at least in part on the audio input data, whether to output second audio data. The method may also include, responsive to determining to output the second audio data: determining, by the computing device, a second volume level lower than the first volume level, and outputting, by the computing device associated with the user and for playback at the second volume level by the audio output device, the second audio data.

In another example, a computing system associated with a user is disclosed, the computing system comprising one or more processors, an audio output device that outputs, at a first volume level, first audio data, an audio input device that receives audio input data, and one or more modules operable. The one or more modules may be operable by the one or more processors to, responsive to determining that the audio input data may include speech associated with an entity different from the user, determine whether to output second audio data, and, responsive to determining to output the second audio data, determine a second volume level lower than the first volume level, wherein the audio output device is further configured to output, at the second volume level, the second audio data.

In another example, a computer-readable storage medium encoded with instructions that, when executed, cause at least one processor of a computing device associated with a user to output, for playback at a first volume level by an audio output device, first audio data, receive audio input data, responsive to determining that the audio input data includes speech associated with an entity different from the user, determine, based at least in part on the audio input data, whether to output second audio data. The instructions may also cause the at least one processor to, responsive to determining to output the second audio data: determine a second volume level lower than the first volume level, and output, for playback at the second volume level by the audio output device, the second audio data.

The details of one or more examples are set forth in the accompanying drawings and the description below. Other features, objects, and advantages will be apparent from the description and drawings, and from the claims.

DETAILED DESCRIPTION

Figure 1:
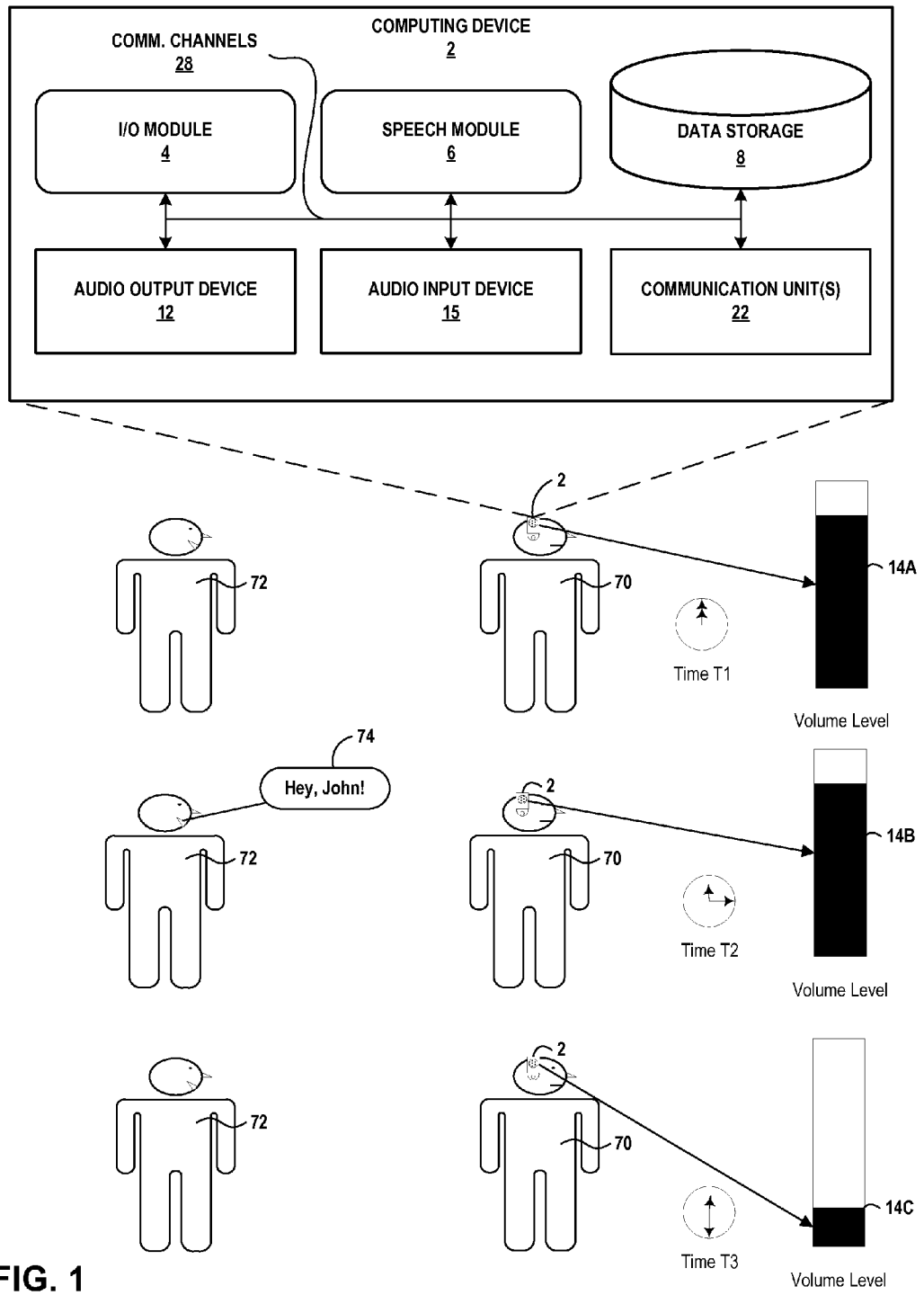
FIG. 1 is a conceptual diagram illustrating an example computing system for dynamically altering audio output based on detected audio input, in accordance with one or more aspects of the present disclosure.

In general, the present disclosure describes techniques that may enable a computing device to dynamically alter a volume level of an audio output in response to determining that an entity different from the user of the computing device is attempting to communicate with the user. For example, while a computing device is outputting audio data, the computing device may detect that the user's name was spoken and, in response, may dynamically reduce the volume level of the audio output or cease outputting the audio. In some examples, responsive to the computing device determining that the conversation is over, the computing device may restore the volume level of the audio output or resume outputting the audio.

By automatically detecting that the entity may be trying to interact with the user, techniques of this disclosure may enable the entity to initiate the interaction similarly to how the entity may initiate the interaction were the user not wearing headphones. The user may notice the change in the audio output and recognize that an entity different from the user may be trying to get his or her attention. That is, rather than requiring someone to raise the volume of his/her voice to an uncomfortable level or physically notifying the user of his/her presence in some way, the techniques of this disclosure may enable the person to get the user's attention and begin a conversation with the user using a normal tone and volume level. Moreover, techniques of this disclosure may not require the user to remove a pair of headphones or to manually alter the volume level of the audio output when attempting to have a conversation or other social interaction with the entity.

Throughout this disclosure, examples are described in which a computing device and/or a computing system may access and/or analyze information (e.g., executing applications, locations, speeds, calendars, communications, audio data, etc.) associated with a computing device only if the computing device receives permission from a user to do so. For example, in situations discussed below in which the computing device may collect or may make use of contextual information associated with a user and/or contextual information associated with the computing device, the user may be provided with an opportunity to provide input to control whether programs or features of the computing device can collect and make use of such information, or to dictate whether and/or how long the computing device may store such information. In addition, if allowed to collect any data, the computing device may treat certain data in one or more ways before the data is stored or used by the computing device and/or a computing system, so that personally-identifiable information is removed. For example, after obtaining location information for the computing device, the geographic location may be generalized (such as to a city, ZIP code, or state level), so that a particular location of the computing device or user cannot be determined. Thus, the user may have control over how information is collected about the user and how information is used by the computing device.

FIG. 1 is a block diagram illustrating an example computing device and audio output device for detecting conversational audio input and, in response, altering a volume output level of audio output data, in accordance with one or more aspects of the present disclosure. As shown in the example of FIG. 1, computing device 2 may include input/output (I/O) module 4, speech module 6, data storage 8, audio output device 12, audio input device 15, and communication units 22.

Computing device 2 may include any number of different portable electronic computing devices, such as a wearable computing device (e.g., a computerized watch, computerized headphones, a computerized headset, computerized glasses, etc.), a smart phone, a personal digital assistant (PDA), a laptop computer, a portable gaming device, a portable media player, an e-book reader, etc. Computing device 2 may include various input and output components, including, e.g. one or more processors, memory, telemetry modules, cellular network antennas, a display, one or more UI elements, sensors, and a power source like a rechargeable battery. Further details of computing device 2 are described in FIG. 2. Other examples of computing device 2 that implement techniques of this disclosure may include additional components not shown in FIG. 1.

Communication channels (COMM. CHANNELS) 28 may interconnect components 4, 6, 8, 12, 15, and/or 22 for inter-component communications (physically, communicatively, and/or operatively). In some examples, communication channels 28 may include a system bus, a network connection, an inter-process communication data structure, or any other method for communicating data.

In the example of FIG. 1, one or more data storage devices 8 may be operable to store information for processing during operation of computing device 2. For instance, computing device 2 may store data that modules 4 and/or 6 may access during execution at computing device 2. In some examples, data storage devices 8 represent temporary memories, meaning that a primary purpose of data storage devices 8 may not be long-term storage. For instance, data storage devices 8 of computing device 2 may be volatile memory, meaning that data storage devices 8 may not retain stored contents if powered off. Examples of volatile memories include random access memories (RAM), dynamic random access memories (DRAM), static random access memories (SRAM), and other forms of volatile memories known in the art.

Data storage devices 8, in some examples, also include one or more computer-readable storage media. Data storage devices 8 may be configured to store larger amounts of information than volatile memory. Data storage devices 8 may further be configured for long-term storage of information. In some examples, data storage devices 8 may include non-volatile storage elements, meaning that data storage devices 8 may maintain information through power on/power off cycles. Examples of non-volatile memories include magnetic hard discs, optical discs, floppy discs, flash memories, or forms of electrically programmable memories (EPROM) or electrically erasable and programmable (EEPROM) memories. Data storage devices 8 may, in some examples, store program instructions and/or information (e.g., data) associated with modules 4 and 6 such as during program execution.

In the example of FIG. 1, one or more communication units 22 may be operable to communicate with external devices via one or more wired and/or wireless networks by transmitting and/or receiving network signals on the one or more networks. Examples of communication units 22 may include a network interface card (e.g. such as an Ethernet card), an optical transceiver, a radio frequency transceiver, a GPS receiver, or any other type of device that can send and/or receive information. Other examples of communication units 22 may include Near-Field Communications (NFC) units, Bluetooth radios, short wave radios, cellular data radios, wireless network radios, as well as universal serial bus (USB) controllers.

In the example of FIG. 1, computing device 2 may include audio output device 12 and audio input device 15. In some examples, audio output device 12 may be a speaker or a set of speakers. In some examples, audio input device 15 may be a microphone. In other examples, audio input device 15 may be a mouthpiece, a MIDI keyboard, a bone conduction transducer, or some other digital instrument. Audio output device 12 and audio input device 15 may communicate with other components of computing device 2, such as modules 4 and 6, data storage 8, or communication unit 22, via communication channels 28. In some examples, audio output device 12 and audio input device 15 may be physically separate from computing device 2 and may be operatively and/or communicatively coupled to computing device 2 using wired and/or wireless communication mechanisms, such as Bluetooth, Wi-Fi, infrared, etc.

As shown in FIG. 1, computing device 2 may include an input/output ("I/O") module 4 and speech module 6. Modules 4 and 6 may perform operations described herein using software, hardware, firmware, or a mixture of hardware, software, and firmware residing in and executing on computing device 2. Computing device 2 may execute modules 4 and 6 in a virtual machine executing on underlying hardware. Modules 4 and 6 may be implemented in various ways. For example, I/O module 4 and speech module 6 may be implemented as a pre-installed application or "app." In another example, modules 4 and 6 may be implemented as part of an operating system of computing device 2.

I/O module 4 may act as an intermediary between various components of computing device 2 and exchange information with the various components of computing device 2. For example, I/O module 4 of computing device 2 may exchange data with other elements of computing device 2, such as audio input device 15, audio output device 12, or speech module 6.

Speech module 6 may process audio input data received by computing system 2. For example, speech module 6 may analyze audio input data to determine whether a user of the computing device is engaged in a conversation or if an entity different from the user of the computing device is attempting to the user's attention. For example, speech module 6 may determine whether the audio input data includes speech from a user of computing device 2 or an entity different than the user of computing device 2. In some examples, speech module 6 may further determine if the audio input data includes conversational keywords or phrases, such as "hello," "hey," "hi", or a name associated with the user (e.g., the user's name, a nickname, etc.).

In accordance with techniques of this disclosure, computing device 2 may automatically determine whether a user of computing device 2 is engaged in a conversation with an entity different from the user or if the entity different from the user would like to get the user's attention and may, based on that determination, dynamically adjust the playback of audio by computing device 2. As one example, at time T1, user 70 is listening to music using computing device 2 (e.g., computerized headphones). Computing device 2 may output the music (e.g., first audio data) for playback at first volume level 14A by audio output device 12. First volume level 14A may be a volume level at which user 70 may typically listen to music. The audio data may be stored at data storage 8 or may be streamed from one or more remote servers or music services using, for example, communication units 22. In either instance, I/O module 4 may send the audio data to audio output device 12 for playback at first volume level 14A using communication channels 28 or other wired and/or wireless communication mechanisms.

While user 70 is listening to the music at volume level 14B, user 72 may attempt to get the attention of user 70. For example, user 72 may say "Hey, John!" (speech 74) at time T2. While described as user 72, in other examples, user 72 could be any entity different from user 70, including an intercom system, a computerized system, a radio, a robotic object, or any other object that outputs audio. In some examples, volume level 14B may be the same volume level as volume level 14A.

Audio input device 15 may detect speech 74 and provide an indication of speech 74 (e.g., audio input data) to I/O module 4, which, in turn, may provide the audio input data to speech module 6. For example, speech module 6 may determine whether the audio input data may include speech associated with an entity different from user 70 or speech associated with user 70. Responsive to receiving the audio input data, speech module 6 may analyze the audio input data by, for example, applying speech recognition techniques to determine if the audio input data includes recognizable words (i.e., speech). If speech module 6 determines that the audio input data does not include speech, computing device 2 may continue to output audio data for playback by audio output device 12 at volume level 14B.

In examples where speech module 6 determines that the audio input data may include speech, computing device 2 may dynamically adjust the audio output by audio output device 12 (e.g., at time T3). As one example, I/O module 4 may cease outputting audio data for playback by audio output device 12. As another example, I/O module 4 may reduce the volume level associated with the audio data (e.g., to volume level 14C) for playback by audio output device 12 such that audio output device 12 may be outputting the audio data at volume level 14C. That is, computing device 2 may, in response to determining that audio input may include speech, dynamically stop playback of audio data by audio output device 12 and/or reduce the volume level of the audio data being output by audio output device 12.

If speech module 6 determines that speech is contained in the audio input data, an indication of such may be sent from speech module 6 to I/O module 4. In some examples, speech 74 may cause the volume of the music's audio output to decrease, enabling user 70 to acknowledge user 72 in a conversational manner as opposed to causing the user 70 to try to speak over the music being played, lower the volume manually, or not acknowledge user 72. In instances where I/O module 4 receives a positive indication that speech module 6 determined that the audio input data includes speech, I/O module 4 may determine whether to stop outputting audio data (e.g., cease outputting the audio data associated with the music) or determine second volume 14C that is lower than first volume 14B. If I/O module 4 determines second volume 14C, then I/O module 4 may output second audio data for playback at second volume 14C by audio output device 12 via communication units 22 and communication channels 28. That is, in some instances, I/O module 4 may output the second audio data (e.g., additional portions of the music) at a lower volume level (e.g., volume 14C) in response to speed module 6 determining that audio input data includes speech.

In some examples, I/O module 4 may alter other characteristics of the second audio data. For instance, I/O module 4 may alter the output of specific frequencies of sound within the second audio data. It may be easier for a user, such as user 70, to hear speech from an entity different from the user if the audio data does not contain frequencies similar to the frequency of the speech. As one example, speech module 6 may measure a frequency of the audio input data and I/O module 4 may lower the volume of frequencies similar to the measured audio input, such as frequencies within 50 Hz or 100 Hz of the measured audio input. In another example, speech module 6 may measure a frequency of the audio input data and I/O module 4 may cease outputting the audio data with frequencies similar to the measured audio input, such as frequencies within 50 Hz or 100 Hz of the measured audio input. As another example, I/O module 4 may lower the volume of all frequencies that fall in the average human spoken voice frequency range. As another example, I/O module 4 may cease outputting the audio data with frequencies that fall in the average human spoken voice frequency range. In other words, in various instances, I/O module 4 may use an equalizer to adjust the balance between various frequency components of the audio data.

In some examples, computing device 2 may determine that users 70 and 72 may be engaged in a conversation. Responsive to determining that the conversation has ended, computing device 2 may automatically resume outputting the audio data (e.g., in examples where computing device 2 ceased outputting the audio data in response to detecting the speech) and/or automatically adjust the volume level of the audio output (e.g., to the volume level at which the audio was being output prior to computing device 2 detecting the speech).

Throughout this disclosure, examples are described in which a computing device and/or a computing system may access and/or analyze information (e.g., executing applications, locations, speeds, calendars, communications, audio data, etc.) associated with a computing device only if the computing device receives permission from a user to do so. For example, in situations discussed below in which the computing device may collect or may make use of contextual information associated with a user and/or contextual information associated with the computing device, the user may be provided with an opportunity to provide input to control whether programs or features of the computing device can collect and make use of such information, or to dictate whether and/or how long the computing device may store such information. In addition, if allowed to collect any data, the computing device may treat certain data in one or more ways before the data is stored or used by the computing device and/or a computing system, so that personally-identifiable information is removed. For example, after obtaining location information for the computing device, the geographic location may be generalized (such as to a city, ZIP code, or state level), so that a particular location of the computing device or user cannot be determined. Thus, the user may have control over how information is collected about the user and how information is used by the computing device.

Figure 2:
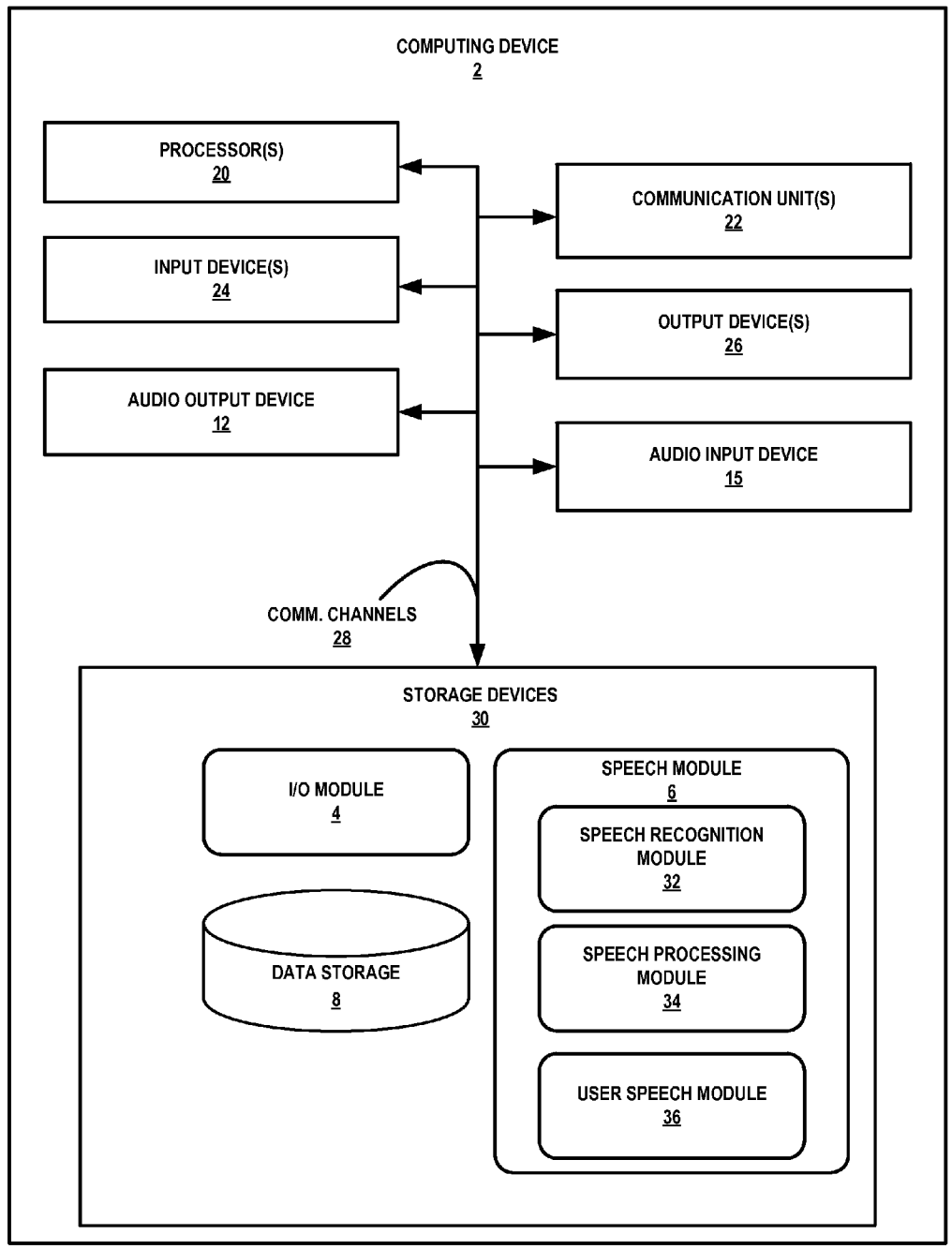
FIG. 2 is a block diagram illustrating further details of an example computing device for dynamically altering audio output based on detected audio input, in accordance with one or more aspects of the present disclosure.

FIG. 2 is a block diagram illustrating further details of an example computing device for dynamically altering audio output based on detected audio input, in accordance with one or more aspects of the present disclosure. FIG. 2 illustrates only one particular example of computing device 2, and many other examples of computing device 2 may be used in other instances and may include a subset of the components included in example computing device 2 or may include additional components not shown in FIG. 2.

Computing device 2 may include additional components that, for clarity, are not shown in FIG. 2. For example, computing device 2 may include a battery to provide power to the components of computing device 2. Similarly, the components of computing device 2 shown in FIG. 2 may not be necessary in every example of computing device 2. For example, in some configurations, computing device 2 may not include communication unit 22.

In the example of FIG. 2, computing device 2 may include audio output device 12, audio input device 15, one or more processors 20, one or more input devices 24, one or more communication units 22, one or more output devices 26, and one or more storage devices 30. Storage devices 30 of computing device 2 may also include I/O module 4, speech module 6, and data storage 8. Speech module 6 may further include speech recognition module 32, speech processing module 34, and user speech module 36. Communication channels 28 may interconnect each of the components 20, 22, 24, 26, 12, 15, 30, 4, 6, 8, 32, 34, and 36 for inter-component communications (physically, communicatively, and/or operatively). In some examples, communication channels 28 may include a system bus, a network connection, an inter-process communication data structure, or any other construct for communicating data. In the example of FIG. 2, audio output device 12, audio input device 15, I/O module 4, and data storage 8 may have similar functionalities to the respective component in the example of FIG. 1.

One or more communication units 22 of computing device 2 may communicate with external devices via one or more networks by transmitting and/or receiving network signals on the one or more networks. For example, computing device 2 may use communication unit 22 to transmit and/or receive radio signals on a radio network such as a cellular radio network. Likewise, communication units 22 may transmit and/or receive satellite signals on a satellite network such as a GPS network. Examples of communication unit 22 may include a network interface card (e.g. such as an Ethernet card), an optical transceiver, a radio frequency transceiver, a GPS receiver, or any other type of device that may send and/or receive information. Other examples of communication units 22 may include Bluetooth®, GPS, 3G, 4G, and Wi-Fi® radios found in mobile devices as well as Universal Serial Bus (USB) controllers.

One or more input devices 24 of computing device 2 may receive input. Examples of input may be tactile, audio, and video input. Input devices 24 of computing device 2, in one example, may include a mouse, keyboard, voice responsive system, video camera, microphone, bone conduction transducer, a sensor, or any other type of device for detecting input from a human or machine. In other examples, input device 24 may be a button, a touchscreen, or some other type of input.

In some examples, input device 24 may be a microphone or a bone conduction transducer configured to detect speech from a user, an entity different from the user, or both. For instance, computing device 2 may be able to, through input device 24, detect speech from the user (e.g., user 70), wherein the speech from the user may be a response to the speech associated with the entity different from the user.

One or more output devices 26 of computing device 2 may generate output. Examples of output may be tactile, audio, and video output. Output devices 26 of computing device 2, in one example, may include a presence-sensitive screen, sound card, video graphics adapter card, speaker, cathode ray tube (CRT) monitor, liquid crystal display (LCD), or any other type of device for generating output to a human or machine. Output devices 26 may include display devices such as cathode ray tube (CRT) monitor, liquid crystal display (LCD), or any other type of device for generating visual output.

As one example, a user may be listening to a podcast using computing device 2 (e.g., a laptop computer with built-in speakers). Computing device 2 may output the podcast (e.g., first audio data) for playback at first volume level 14A by audio output device 12 (e.g., the laptop speakers). First volume level 14A may be a volume level at which user 70 may typically listen to podcasts. The audio data may be stored at data storage 8 or may be streamed from one or more remote servers or music services using, for example, communication units 22. In either instance, I/O module 4 may send the audio data to audio output device 12 for playback at first volume level 14A using communication channels 28 or other wired and/or wireless communication mechanisms.

While user 70 is listening to the podcast at volume level 14B, user 72 may attempt to get the attention of user 70. For example, user 72 may say "Hey, John!" (speech 74) at time T2. While described as user 72, in other examples, user 72 could be any entity different from user 70, including an intercom system, a computerized system, a radio, a robotic object, or any other object that outputs audio. In some examples, volume level 14B may be the same volume level as volume level 14A.

Audio input device 15 (e.g., a microphone) may detect speech 74 (e.g., audio input data) and provide an indication of speech 74 to I/O module 4, which, in turn, may provide the audio input data to speech module 6. In some examples, speech module 6 may contain multiple different modules to perform the functionality as described with respect to FIG. 1. For instance, speech module 6 may contain speech recognition module 32, speech processing module 34, and user speech module 36. In some examples, speech recognition module 32 may receive audio input data from I/O module 4 and process the audio input data to determine if the audio input data contains speech. Speech recognition module 32 may do this by measuring any ambient noise in the vicinity of the user and detecting spikes in the received audio input data. In the examples of the present disclosure, spikes may refer to a sharp increase in the magnitude of sound waves in the vicinity of the user followed by a sharp decline in the magnitude of sound waves in the vicinity of the user. These spikes may indicate that the audio input data may include indications of sound, such as speech, that may be different from the general ambient noise. For example, the user 70 in this example may have the ambient noise from the laptop speakers and other environmental factors. Speech 74 may then be determined as a spike, as it represents a sharp increase in the magnitude of sound waves in the vicinity of user 70 followed by a sharp decrease in the magnitude of sound waves in the vicinity of user 70. If speech recognition module 32 determines that a spike is present that may comprise speech, speech recognition module 32 may forward the audio input data to speech processing module 34.

In some examples, speech processing module 34 may determine if the spike determined by speech recognition module 32 included speech. Speech processing module 34 may determine if the spike in the audio input data corresponds to speech, and if so, it may determine one or more words included the audio input data by applying speech recognition techniques to determine if the audio input data includes recognizable words. In some examples, speech processing module 34 may determine if the speech contains conversational keywords. Conversational keywords may be any words typically used to start a conversation. Examples could include the words or phrases "hello," "hey," "hi," "howdy," or "you there," although these keywords could be expanded based on the culture, language, slang, or formality of the user. In other examples, the conversational keyword could be the user's name or a name associated with the user. In this example, speech processing module 34 may receive the audio input data consisting of the words, "Hey, John!" in speech 74 and determine that the conversational keywords component of the speech recognition is satisfied. In some examples, speech processing module 34 may further determine if the speech from an entity other than the user may be detected at a volume that satisfies a threshold volume value.

If speech processing module 34 determines that speech is contained in the audio input data, and indication of such will be sent from speech processing module 34 to I/O module 4. Speech 74 would cause the volume of the podcast's audio output to decrease, allowing user 70 to acknowledge user 72 in a conversational manner as opposed to causing the user 70 to try to speak over the podcast being played, lower the volume manually, or not acknowledge user 72 at all. When I/O module 4 receives the positive indication that the audio input data contained speech, I/O module 4 determines whether to stop outputting audio data (i.e. stop the podcast and completely cease outputting audio data) or to determine a second volume 14C that is lower than the first volume 14B. If I/O module 4 determines a second volume 14C, then I/O module 4 will output second audio data for playback at second volume 14C by audio output device 12 via communication units 22 and communication channels 28.

In some examples, user speech module 36 may also be able to process speech from the user or implement a machine learning algorithm. Computing device 2 may receive second audio input data, wherein the second audio input is speech that may be associated with the user 70 (e.g., the user begins talking while using computing device 2). Computing device 2, using user speech module 36, may measure various speech characteristics of the speech from the user. In some examples, the speech characteristics may be any of pitch, volume, rhythm, timbre, accent, phonetics, articulation, head movement, pauses, fluctuation of any of the above characteristics, or a combination of any of the above characteristics. Computing device 2 may store the measured speech characteristics. In some examples, these speech characteristics may be stored in data storage 8. Computing device 2 may determine whether a user is speaking based at least in part on a comparison between a third audio input data (e.g., another instance of user 70 talking while using computing device 2) and the stored speech characteristics. For instance, if the third audio input has similar pitch, volume, rhythm, timbre, accent, phonetics, articulation, head movement, pauses, fluctuation of any of the above characteristics, or a combination of any of the above characteristics to the speech characteristics stored by computing device 2, then computing device 2 may determine that the user may be speaking. If computing device 2 determines that user 70 is speaking, computing device 2 may determine whether to output third audio data (e.g., other portions of the podcast that the user is currently listening to). If computing device 2 determines to output the third audio data, the computing device may determine a third volume level lower than the first volume level. Over time, computing device 2 may use user speech module 36 to continually refine the stored speech characteristics to more closely match user 70's specific speech characteristics. For instance, user speech module 36 may gather various data points of the stored speech characteristics over time to track how variable user 70's speech characteristics may be. By referencing multiple data points, user speech module 36 may become more accurate in predicting whether user 70 is speaking.

User speech module 36 may also compile data from multiple input devices to determine if a user is speaking. For instance, user speech module 36 may receive an indication from I/O module 4 that an entity different from the user 70 (e.g., user 72) is speaking to user 70. Input device 24 may comprise a sensor on computing device 2 and a bone conduction transducer inside of an earpiece on audio output device 12. Audio input device 15 may be able to determine a direction that the speech associated with user 72 is coming from. The sensor may also determine a direction that user 70 or computing device 2 is currently facing. User speech module 36 may receive an indication of these directions and compare them to see if user 70 (or computing device 2) is facing an origin point of the speech associated with user 72. The bone conduction transducer may receive audio input from user 70 if user 70 is further speaking in response to the speech from user 72. The bone conduction transducer may send this audio input data to I/O module 4, which forwards the audio input data to user speech module 36. User speech module 36 may determine that the user is speaking based on this audio input data. The combination of user speech module 36 determining that user 70 is looking in the same direction as where the speech associated with user 72 is coming from and determining that user 70 is speaking may indicate that the volume level should be lowered. User speech module 36 may send this indication to I/O module 4, which may lower the volume level at which audio data will be played back at.

One or more processors 20 may implement functionality and/or execute instructions within computing device 2. For example, processors 20 on computing device 2 may receive and execute instructions stored by storage devices 30 that execute the functionality of I/O module 4, speech module 6, speech recognition module 32, speech processing module 34, and user speech module 36. These instructions executed by processors 20 may cause computing device 2 to store information, within storage devices 30 during program execution. Processors 20 may execute instructions of I/O module 4, speech module 6, speech recognition module 32, speech processing module 34, and user speech module 36 to cause audio output device 12 to output audio data at various volumes. That is, items in storage device 30, such as I/O module 4, speech module 6, speech recognition module 32, speech processing module 34, and user speech module 36, may be operable by processors 20 to perform various actions, including causing audio output device 12 to output audio data at various volumes, as shown in FIG. 1.

In some examples, input device 24 may be a button, a touchscreen, or some other type of input, wherein, responsive to receiving an indication of input from the user at input device 24, computing device 2 outputs, for playback at the first volume level (e.g., first volume level 14B) by audio output device 12, third audio data. For instance, if the volume was lowered or stopped, user 70 may use input device 24 to continue listening to the podcast at volume level 14B rather than volume level 14C.

In some examples, the one or more processors 28 may execute instructions for outputting, for playback at a first volume level by an audio output device (e.g., audio output device 12), first audio data. The instructions may cause the one or more processors 28 to receive audio input data. Responsive to determining that the audio input data includes speech associated with an entity different from the user, the instructions may cause the one or more processors 28 to determine, based at least in part on the audio input data, whether to output second audio data. Responsive to determining to output the second audio data, the instructions may cause the one or more processors 28 to determine a second volume level lower than the first volume level. The instructions may cause the one or more processors 28 to output, for playback at the second volume level by the audio output device, the second audio data.

Figure 3:
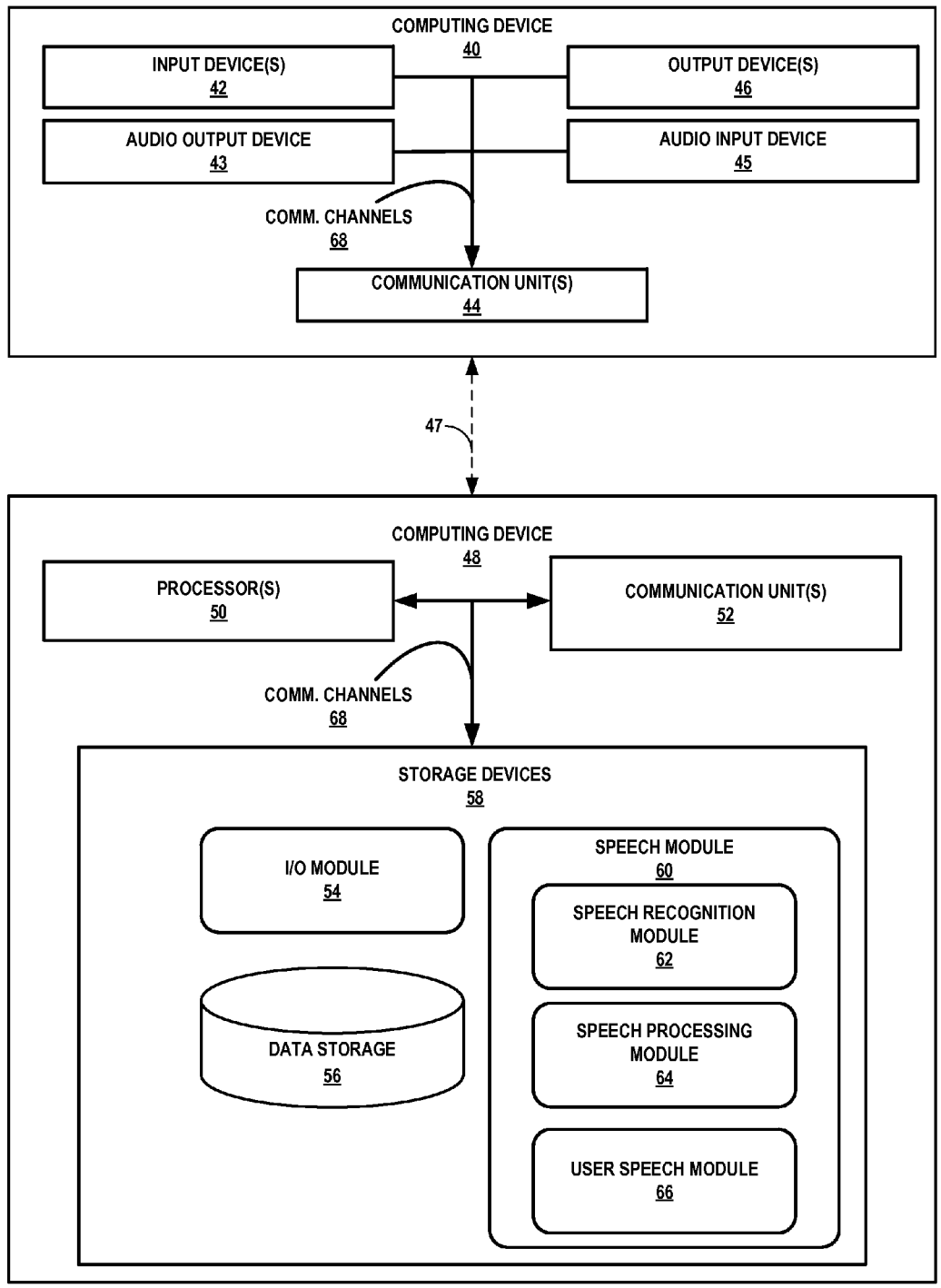
FIG. 3 is a block diagram illustrating an example computing device for dynamically altering audio output at a second computing device based on detected audio input from the second computing device, in accordance with one or more aspects of the present disclosure.

FIG. 3 is a block diagram illustrating an example computing device for dynamically altering audio output at a second computing device based on detected audio input from the second computing device, in accordance with one or more aspects of the present disclosure. In some examples in accordance with the present disclosure, the computing device that executes techniques of the present disclosure may be coupled to a second computing device that outputs the audio data at an audio output device and provides audio input data to the first computing device. For example, computing device 48 may include any number of different portable electronic computing devices, such as a wearable computing device (e.g., a computerized watch, a computerized headset, computerized glasses, etc.), a smart phone, a personal digital assistant (PDA), a laptop computer, a portable gaming device, a portable media player, an e-book reader, etc., while computing device 40 may be headphones, a headset, or some other combination of an audio input device, such as a microphone, and an audio output device, such as speakers. Computing device 48 may be coupled to computing device 40, which contains an audio output device 12 and an audio input device 15. For instance, computing device 48 may be a portable media player that uses audio input device 15 and audio output device 12 in computing device 40, which may be headphones, as peripherals coupled to computing device 48 to provide speech detection and playback functionality, respectively. Computing device 48 and/or computing device 40 may include various input and output components, including, e.g. one or more processors, memory, telemetry modules, cellular network antennas, a display, one or more UI elements, sensors, and a power source like a rechargeable battery.

Computing device 40 and/or computing device 48 may include additional components that, for clarity, are not shown in FIG. 3. For example, computing device 40 and/or computing device 48 may include a battery to provide power to the components of computing device 40 and/or computing device 48. Similarly, the components of computing device 40 and/or computing device 48 shown in FIG. 3 may not be necessary in every example of computing device 40 and/or computing device 48. For example, in some configurations, computing device 40 and/or computing device 48 may not include communication units 44 and/or 52. Storage devices 58 of computing device 48 may also include I/O module 54, speech module 60, and data storage 56.

Computing device 40 and computing device 48 each contain one or more communication units 44 and 52, respectively, that communicate with one another via link 47. One or more communication units 44 and 52 of computing devices 40 and 48 may communicate with external devices via one or more wired and/or wireless networks by transmitting and/or receiving network signals on the one or more networks. For example, computing devices 40 and 48 may use communication units 44 and 52 to transmit and/or receive radio signals on a radio network such as a cellular radio network. Likewise, communication units 44 and 52 may transmit and/or receive satellite signals on a satellite network such as a GPS network. Examples of communication units 44 and 52 include a network interface card (e.g. such as an Ethernet card), an optical transceiver, a radio frequency transceiver, a GPS receiver, or any other type of device that may send and/or receive information. Other examples of communication units 44 and 52 may include Bluetooth®, GPS, 3G, 4G, and Wi-Fi® radios found in mobile devices as well as Universal Serial Bus (USB) controllers.

Communication units 44 and 52 communicate with one another via link 47. Link 47 may be a hard-linked connection, such as a cable or an Ethernet connection, that physically connects computing device 40 and computing device 48. Link 47 may also be a wireless link, such as Bluetooth®, GPS, 3G, 4G, and Wi-Fi®.

Communication channels (COMM. CHANNELS) 68 may interconnect components 42, 43, 44, 45, and/or 46 in computing device 40 and components 50, 52, 54, 56, 58, 60, 62, 64, and/or 66 in computing device 48 for inter-component communications (physically, communicatively, and/or operatively). In some examples, communication channels 68 may include a system bus, a network connection, an inter-process communication data structure, or any other method for communicating data.

In the example of FIG. 3, one or more data storage devices 56 may be operable to store information for processing during operation of computing device 48. For instance, computing device 48 may store data that modules 54 and/or 60 may access during execution at computing device 48. In some examples, data storage devices 56 represent temporary memories, meaning that a primary purpose of data storage devices 56 may not be long-term storage. For instance, data storage devices 56 of computing device 48 may be volatile memory, meaning that data storage devices 56 may not retain stored contents if powered off. Examples of volatile memories include random access memories (RAM), dynamic random access memories (DRAM), static random access memories (SRAM), and other forms of volatile memories known in the art.

Data storage devices 56, in some examples, also include one or more computer-readable storage media. Data storage devices 56 may be configured to store larger amounts of information than volatile memory. Data storage devices 56 may further be configured for long-term storage of information. In some examples, data storage devices 56 may include non-volatile storage elements, meaning that data storage devices 56 may maintain information through power on/power off cycles. Examples of non-volatile memories include magnetic hard discs, optical discs, floppy discs, flash memories, or forms of electrically programmable memories (EPROM) or electrically erasable and programmable (EEPROM) memories. Data storage devices 56 may, in some examples, store program instructions and/or information (e.g., data) associated with modules 54 and 56 such as during program execution.

In the example of FIG. 3, computing device 40 may include audio output device 43 and audio input device 45. In some examples, audio output device 43 may be a speaker or a set of speakers. In some examples, audio input device 45 may be a microphone. In other examples, audio input device 45 may be a mouthpiece, a MIDI keyboard, a bone conduction transducer, or some other digital instrument. Audio output device 43 and audio input device 45 may communicate with components of computing device 48, such as modules 54 and 60, data storage 56, or communication unit 52, via communication channels 68, communication unit 44, and link 47. In some examples, audio output device 43 and/or audio input device 45 may be physically separate from computing device 48 and may be operatively and/or communicatively coupled to computing device 48 using wired and/or wireless communication mechanisms, such as Bluetooth, Wi-Fi, infrared, etc.

As shown in FIG. 3, computing device 48 may include an input/output ("I/O") module 54 and speech module 60. Modules 54 and 60 may perform operations described herein using software, hardware, firmware, or a mixture of hardware, software, and firmware residing in and executing on computing device 48. Computing device 48 may execute modules 54 and 60 in a virtual machine executing on underlying hardware. Modules 54 and 60 may be implemented in various ways. For example, I/O module 54 and speech module 60 may be implemented as a pre-installed application or "app." In another example, modules 54 and 60 may be implemented as part of an operating system of computing device 48.

I/O module 54 may act as an intermediary between various components of computing device 48 and exchange information with the various components of computing device 48. For example, I/O module 54 of computing device 48 may exchange data with other elements of computing device 40 and/or computing device 48, such as audio input device 45, audio output device 43, or speech module 60.

Speech module 60 may process any audio input data received by computing system 48. For example, speech module 60 may analyze audio input data to determine whether a user of the computing device is engaged in a conversation or if an entity different from the user of the computing device is attempting to the user's attention. In some examples, speech module 60 may contain multiple different modules (e.g., speech recognition module 62, speech processing module 64, and/or user speech module 66) to perform the functionality as described with respect to FIG. 3.

One or more input devices 42 of computing device 40 may receive input. Examples of input may be tactile, audio, and video input. Input devices 42 of computing device 40, in one example, may include a mouse, keyboard, voice responsive system, video camera, microphone, bone conduction transducer, a sensor, or any other type of device for detecting input from a human or machine. In other examples, input device 42 may be a button, a touchscreen, or some other type of input.

In some examples, input device 42 may be a microphone or a bone conduction transducer configured to detect speech from a user, an entity different from the user, or both. For instance, computing device 40 may be able to, through input device 42, detect speech from the user (e.g., user 70), wherein the speech from the user may be a response to the speech associated with the entity different from the user.

One or more output devices 46 of computing device 40 may generate output. Examples of output may be tactile, audio, and video output. Output devices 46 of computing device 40, in one example, may include a presence-sensitive screen, sound card, video graphics adapter card, speaker, cathode ray tube (CRT) monitor, liquid crystal display (LCD), or any other type of device for generating output to a human or machine. Output devices 46 may include display devices such as cathode ray tube (CRT) monitor, liquid crystal display (LCD), or any other type of device for generating visual output.

The example of FIG. 3 may perform techniques similar to those disclosed with respect to FIGS. 1 and 2. Referencing some aspects of FIG. 1, the system of computing device 40 and computing device 48 may replace computing device 2 of FIG. 1 in the following example. In this embodiment, computing device 48 changes the volume of audio output at an audio output device 43 in computing device 40 based on the detection of speech in an audio input associated with an entity other than a user. In one example, computing device 40 may be speakers connected to a television set (e.g., output device 46) that outputs audio (e.g., first audio data) associated with a movie being displayed on the television set, and computing device 48 may be a server. First volume level 14A may be a volume level at which user 70 may typically listen to movies. The audio data may be stored at data storage 56 or may be streamed from one or more remote servers or music services using, for example, communication units 44 and 52 via link 47. In either instance, I/O module 54 may send the audio data to audio output device 43 for playback at first volume level 14A via communication units 44 and 52, communication channels 68, and link 47 or other wired and/or wireless communication mechanisms.

While user 70 is listening to the movie at volume level 14B, user 72 may attempt to get the attention of user 70. For example, user 72 may say "Hey, John!" (speech 74) at time T2. While described as user 72, in other examples, user 72 could be any entity different from user 70, including an intercom system, a computerized system, a radio, a robotic object, or any other object that outputs audio. In some examples, volume level 14B may be the same volume level as volume level 14A.

Audio input device 45 (e.g., a microphone in the speaker housing) may detect speech 74 (e.g., audio input data) and provide an indication of speech 74 to I/O module 54 on a server via communication units 44 and 52, communication channels 68, and link 47, which, in turn, may provide the audio input data to speech module 60. In some examples, speech module 60 may contain multiple different modules to perform the functionality as described with respect to FIG. 1. For instance, speech module 60 may contain speech recognition module 62, speech processing module 64, and user speech module 66. In some examples, speech recognition module 62 may receive audio input data from I/O module 54 and process the audio input data to determine if the audio input data contains speech. Speech recognition module 62 may do this by measuring any ambient noise in the vicinity of the user and detecting spikes in the received audio input data. In the examples of the present disclosure, spikes may refer to a sharp increase in the magnitude of sound waves in the vicinity of the user followed by a sharp decline in the magnitude of sound waves in the vicinity of the user. These spikes may indicate that the audio input data may include indications of sound, such as speech, that may be different from the general ambient noise. For example, the user 70 in this example may have the ambient noise from the television speakers and other environmental factors. Speech recognition module 62 may determine that speech 74 may be a spike, as it represents a sharp increase in the magnitude of sound waves in the vicinity of user 70 followed by a sharp decrease in the magnitude of sound waves in the vicinity of user 70. If speech recognition module 62 determines that a spike is present that may comprise speech, speech recognition module 62 may forward the audio input data to speech processing module 64.

In some examples, speech processing module 64 may determine if the spike determined by speech recognition module 62 included speech. Speech processing module 64 may determine if the spike in the audio input data corresponds to speech, and if so, it may determine one or more words included the audio input data by applying speech recognition techniques to determine if the audio input data includes recognizable words. In some examples, speech processing module 64 may determine if the speech contains conversational keywords. Conversational keywords may be any words typically used to start a conversation. Examples could include the words or phrases "hello," "hey," "hi," "howdy," or "you there," although these keywords could be expanded based on the culture, language, slang, or formality of the user. In other examples, the conversational keyword could be the user's name or a name associated with the user. In this example, speech processing module 64 may receive the audio input data consisting of the words, "Hey, John!" in speech 74 and determine that the conversational keywords component of the speech recognition is satisfied. In some examples, speech processing module 64 may further determine if the speech from an entity other than the user may be detected at a volume that satisfies a threshold volume value.

If speech processing module 64 determines that speech is contained in the audio input data, and indication of such will be sent from speech processing module 64 to I/O module 54. Speech 74 would cause the volume of the movie's audio output to decrease, allowing user 70 to acknowledge user 72 in a conversational manner as opposed to causing the user 70 to try to speak over the movie being played, lower the volume manually, or not acknowledge user 72 at all. When I/O module 54 receives the positive indication that the audio input data contained speech, I/O module 54 determines whether to stop outputting audio data (i.e. stop the movie and completely cease outputting audio data) or to determine a second volume 14C that is lower than the first volume 14B. If I/O module 54 determines a second volume 14C, then I/O module 54 will output second audio data for playback at second volume 14C by audio output device 43 via communication units 44 and 52, communication channels 68, and link 47.

In some examples, user speech module 36 may also be able to process speech from the user or implement a machine learning algorithm. Computing device 40 may receive second audio input data, wherein the second audio input is speech that may be associated with the user 70 (e.g., the user begins talking while using computing device 40). Computing device 48, using user speech module 66, may measure various speech characteristics of the speech from the user. In some examples, the speech characteristics may be any of pitch, volume, rhythm, timbre, accent, phonetics, articulation, head movement, pauses, fluctuation of any of the above characteristics, or a combination of any of the above characteristics. Computing device 48 may store the measured speech characteristics. In some examples, these speech characteristics may be stored in data storage 56. Computing device 48 may determine whether a user is speaking based at least in part on a comparison between a third audio input data (e.g., another instance of user 70 talking while using computing device 40) and the stored speech characteristics. For instance, if the third audio input has similar pitch, volume, rhythm, timbre, accent, phonetics, articulation, head movement, pauses, fluctuation of any of the above characteristics, or a combination of any of the above characteristics to the speech characteristics stored by computing device 48, then computing device 48 may determine that the user may be speaking. If computing device 48 determines that user 70 is speaking, computing device 48 may determine whether to output third audio data (e.g., other portions of the podcast that the user is currently listening to). If computing device 48 determines to output the third audio data, computing device 48 may determine a third volume level lower than the first volume level. Over time, computing device 48 may use user speech module 66 to continually refine the stored speech characteristics to more closely match user 70's specific speech characteristics. For instance, user speech module 66 may gather various data points of the stored speech characteristics over time to track how variable user 70's speech characteristics may be. By referencing multiple data points, user speech module 66 may become more accurate in predicting whether user 70 is speaking.

User speech module 66 may also compile data from multiple input devices to determine if a user is speaking. For instance, user speech module 66 may receive an indication from I/O module 54 that an entity different from the user 70 (e.g., user 72) is speaking to user 70. Input device 42 may comprise a sensor on computing device 40 and a bone conduction transducer inside of an earpiece on audio output device 43. Audio input device 45 may be able to determine a direction that the speech associated with user 72 is coming from. The sensor may also determine a direction that user 70 or computing device 2 is currently facing. User speech module 36 may receive an indication of these directions and compare them to see if user 70 (or computing device 2) is facing an origin point of the speech associated with user 72. The bone conduction transducer may receive audio input input from user 70 if user 70 is further speaking in response to the speech from user 72. The bone conduction transducer may send this audio input data to I/O module 54, which forwards the audio input data to user speech module 66. User speech module 66 may determine that the user is speaking based on this audio input data. The combination of user speech module 66 determining that user 70 is looking in the same direction as where the speech associated with user 72 is coming from and determining that user 70 is speaking may indicate that the volume level should be lowered. User speech module 66 may send this indication to I/O module 54, which may lower the volume level at which audio data will be played back at.

In some examples, input device 42 may be a button, a touchscreen, or some other type of input, wherein, responsive to receiving an indication of input from the user at input device 42, computing device 48 outputs, for playback at the first volume level (e.g., first volume level 14B) by audio output device 43, third audio data. For instance, if the volume was lowered or stopped, user 70 may use input device 42 to continue listening to the podcast at volume level 14B rather than volume level 14C.

One or more processors 50 may implement functionality and/or execute instructions within computing device 40. For example, processors 50 on computing device 40 may receive and execute instructions stored by storage devices 30 that execute the functionality of I/O module 54, speech module 60, speech recognition module 62, speech processing module 64, and user speech module 66. These instructions executed by processors 50 may cause computing device 48 to store information, within storage devices 58 during program execution. Processors 50 may execute instructions of I/O module 54, speech module 60, speech recognition module 62, speech processing module 64, and user speech module 66 to cause audio output device 43 of computing device 40 to output audio data at various volumes. That is, items in storage device 58, such as I/O module 54, speech module 60, speech recognition module 62, speech processing module 64, and user speech module 66, may be operable by processors 50 to perform various actions, including causing audio output device 43 of computing device 40 to output audio data at various volumes, as shown in FIG. 3.

Throughout this disclosure, examples may be described in which a computing device and/or a computing system may access and/or analyze information (e.g., executing applications, locations, speeds, calendars, communications, audio data, etc.) associated with a computing device only if the computing device receives permission from a user to do so. For example, in situations discussed below in which the computing device may collect or may make use of contextual information associated with a user and/or contextual information associated with the computing device, the user may be provided with an opportunity to provide input to control whether programs or features of the computing device can collect and make use of such information, or to dictate whether and/or how long the computing device may store such information. In addition, if allowed to collect any data, the computing device may treat certain data in one or more ways before the data is stored or used by the computing device and/or a computing system, so that personally-identifiable information is removed. For example, after obtaining location information for the computing device, the geographic location may be generalized (such as to a city, ZIP code, or state level), so that a particular location of the computing device or user cannot be determined. Thus, the user may have control over how information is collected about the user and how information is used by the computing device.

Figure 4:
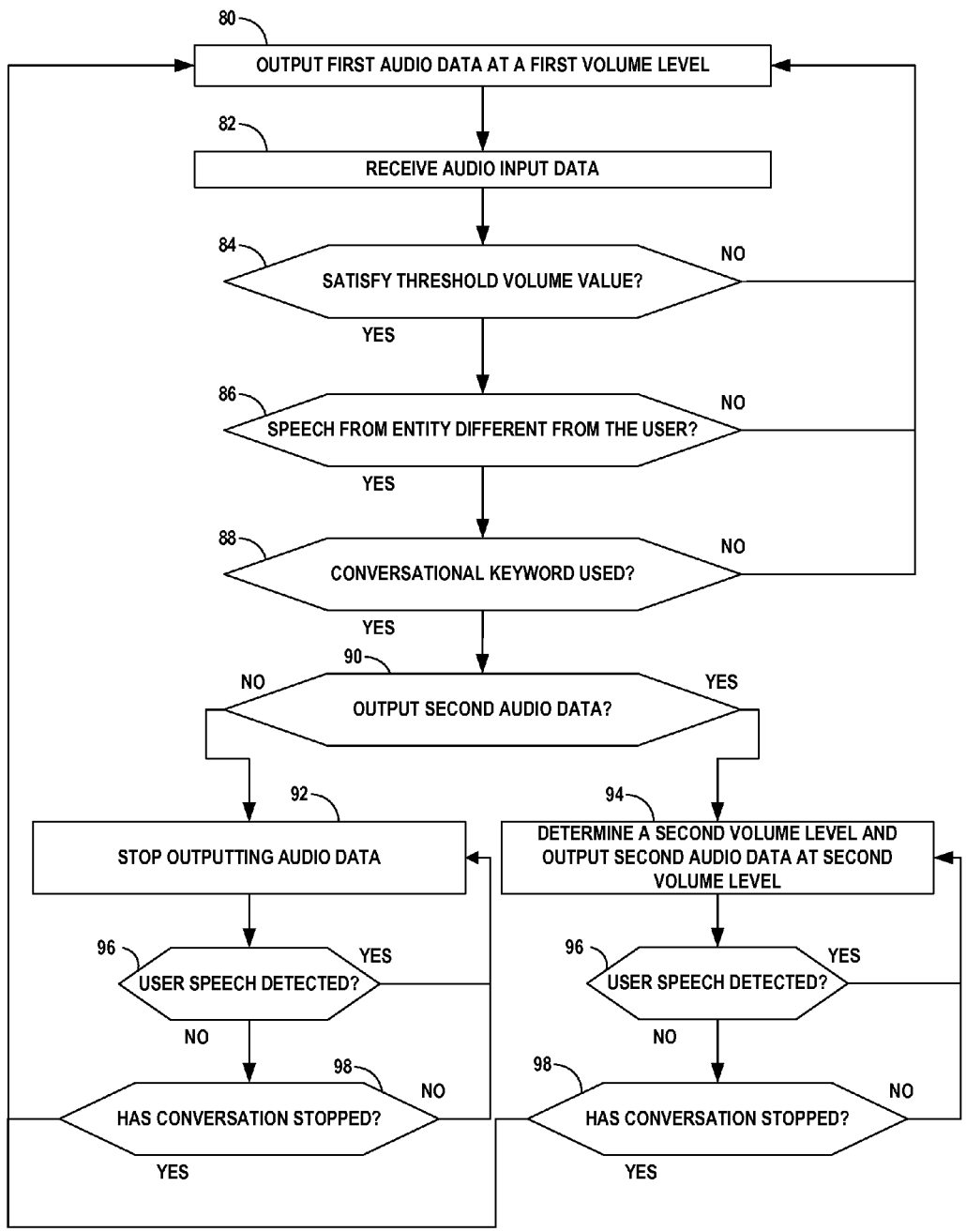
FIG. 4 is a flow diagram illustrating example operations for detecting a conversation and dynamically altering the output level of audio data, in accordance with one or more aspects of the present disclosure.

FIG. 4 is a flow diagram illustrating example operations for detecting a conversation and dynamically altering the output level of audio data, in accordance with one or more aspects of the present disclosure. For purposes of illustration only, the example operations of FIG. 4 are described below within the context of FIGS. 1 and 2.

In the example of FIG. 4, a computing device (e.g., computing device 2) outputs, for playback at a first volume level (e.g., volume level 14A) by an audio output device (e.g., audio output device 12), first audio data (80). Computing device 2 may receive audio input data (e.g., speech 74) using audio input device 15 (82).

The computing device may determine if the received audio input satisfies a threshold volume value (84). For example, the computing device may measure, in decibels, the received audio input and compare it to a threshold decibel value, determining if the received audio input exceeds the decibel level of the threshold decibel value.

The computing device may determine if the received audio input data contains speech from an entity different from the user (e.g., entity 72) (86). For instance, speech module 6 may contain speech recognition module 32, speech processing module 34, and user speech module 36. In some examples, speech recognition module 32 may receive audio input data from I/O module 4 and process the audio input data to determine if the audio input data contains speech. Speech recognition module 32 may do this by measuring any ambient noise in the vicinity of the user and detecting spikes in the received audio input data. In the examples of the present disclosure, spikes may refer to a sharp increase in the magnitude of sound waves in the vicinity of the user followed by a sharp decline in the magnitude of sound waves in the vicinity of the user. These spikes may indicate that the audio input data may include indications of sound, such as speech, that may be different from the general ambient noise. For example, the user 70 in this example may have the ambient noise from the laptop speakers and other environmental factors. Speech 74 may then be determined as a spike, as it represents a sharp increase in the magnitude of sound waves in the vicinity of user 70 followed by a sharp decrease in the magnitude of sound waves in the vicinity of user 70. If speech recognition module 32 determines that a spike is present that may comprise speech, speech recognition module 32 may forward the audio input data to speech processing module 34. In some examples, speech processing module 34 may determine if the spike determined by speech recognition module 32 included speech. Speech processing module 34 may determine if the spike in the audio input data corresponds to speech, and if so, it may determine one or more words included the audio input data by applying speech recognition techniques to determine if the audio input data includes recognizable words.

The computing device may determine if a conversational keyword is used (88). For example, the computing device may determine if the audio input may include the words or phrases "hello," "hey," "hi," "howdy," or "you there," although these keywords could be expanded based on the culture, language, slang, or formality of the user. In other examples, the conversational keyword could be the user's name or a name associated with the user.

For any of the determinations listed in steps 84, 86, or 88, if the computing device makes a negative determination ("NO" branches of 84, 86, or 88), the computing device may continue to output the first audio data for playback at the first volume level by the audio output device. In some examples, only some combination of these determinations may be made. In some examples, only one of these determinations may be made. Otherwise, the process may continue ("YES" branches of 84, 86, and/or 88).

The computing device may determine whether to output second audio data (90). In some examples, the computing device may stop outputting audio data ("NO branch of 90, or 92), meaning that no audio data is sent to the audio output device, so the audio output device does not emit any sound. In other examples, the computing device may determine a second volume level (e.g., second volume level 14C) that may be lower than the first volume level and the computing device may output the second audio data for playback at the second volume level by the audio output device ("YES" branch of 90, or 94).

In some examples, regardless of whether the computing device determines to output the second audio data, the computing device may determine if user speech is detected (96). The computing device may detect speech from the user, wherein the speech from the user may be a response to the speech associated with the entity different from the user. If user speech is detected, the computing device may continue performing the steps of 92 or 94 (based on whether the computing device determined to output the second audio data, the "YES" branch of 96). For example, if the computing device determined to output the second audio data for playback at the second volume level buy the audio output device, the computing device may continue to output the second audio data for as long as user speech is detected.

In some examples, the computing device may detect a pattern of speech between the user and the entity different from the user and, based on this pattern of speech, determine that a conversation is occurring. In these examples, the computing device may continue ceasing to output the second audio data or may continue outputting the second audio data for playback at a second volume level by the audio output device for as long as the computing device determines that the conversation may be occurring. For instance, the computing device may detect that the pattern of speech has ended between the user and the entity different from the user. The computing device may determine that the conversation has ended based on the ending of the pattern of speech. The computing device may therefore output, for playback at the first volume level by the audio output device, third audio data. With respect to FIG. 4, if the computing device determines that user speech is no longer detected ("NO" branch of 96), the computing device may determine if the conversation has stopped (98). The conversation may have stopped if the computing device no longer detects that the entity different from the user is no longer speaking and that the user is no longer speaking. If the computing device determines that the conversation has not stopped ("NO" branch of 98), the computing device may continue ceasing to output the second audio data or may continue outputting the second audio data for playback at a second volume level by the audio output device. If the computing device determines that the conversation has stopped ("YES" branch of 98), the computing device may output audio data for playback at the first volume level by the audio output device.

Figure 5:
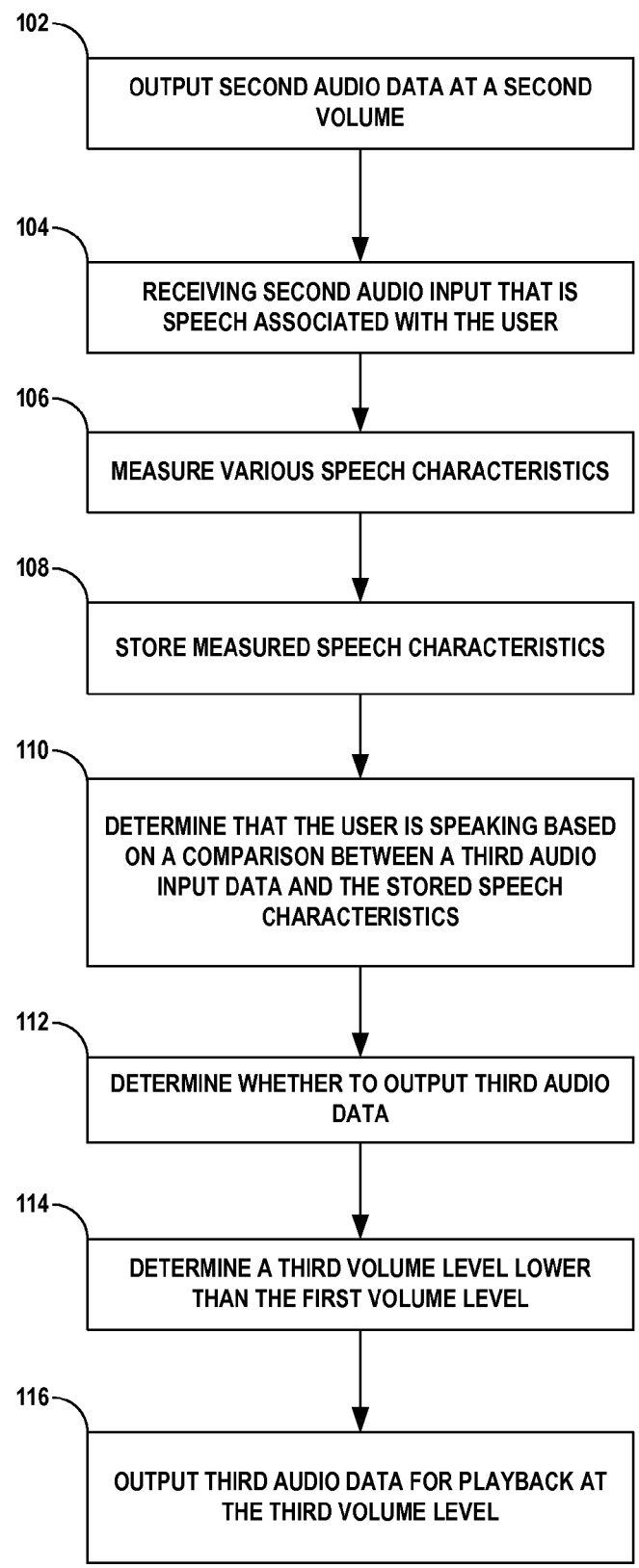
FIG. 5 is a flow diagram illustrating example operations for determining conversational habits of a user, in accordance with one or more aspects of the present disclosure.

FIG. 5 is a flow diagram illustrating example operations for determining conversational habits of a user, in accordance with one or more aspects of the present disclosure. For purposes of illustration only, the example operations of FIG. 4 are described below within the context of FIGS. 1 and 2.

In the example of FIG. 5, the computing device (e.g., computing device 2) may output second audio data for playback at a second volume level (e.g. volume level 14C) by the audio output device (e.g., audio output device 12) (102). This indicates to the computing device that the user may be participating in the conversation. According to the example of FIG. 5, the computing device may analyze the user's speaking voice to determine when the user is participating in a conversation. If the computing device can determine when the user may be participating in a conversation based on the user's speaking voice rather than speech from an entity different from the user, the computing device may be functional in instances where the user may be initiating the conversation. The example of FIG. 5 gives the computing device this functionality.

Once the computing device is outputting the audio data for playback at a second volume level, the computing device may receive second audio input data, wherein the second audio input is speech that may be associated with the user (104). The computing device, using user speech module 36, may measure various speech characteristics of the second audio input data (106). In some examples, the speech characteristics may be any of pitch, volume, rhythm, timbre, accent, phonetics, articulation, head movement, pauses, fluctuation of any of the above characteristics, or a combination of any of the above characteristics. The computing device stores the measured speech characteristics (108). In some examples, these speech characteristics may be stored in data storage 8.

The computing device determines whether a user is speaking based at least in part on a comparison between a third audio input data and the stored speech characteristics (110). For instance, if the third audio input has similar pitch, volume, rhythm, timbre, accent, phonetics, articulation, head movement, pauses, fluctuation of any of the above characteristics, or a combination of any of the above characteristics to the speech characteristics stored by computing device 2, then the computing device may determine that the user may be speaking.

If the computing device determines that the user is speaking, the computing device may determine whether to output third audio data (112). If the computing device determines to output the third audio data, the computing device may determine a third volume level lower than the first volume level (114). The computing device may output the third audio data for playback at the third volume level by the audio output device (116).

In one embodiment, responsive to the computing device determining that the audio input may include speech associated with an entity different from the user, the computing device may receive second audio input data, wherein the second audio input data may be speech associated with the user. The computing device may measure speech characteristics of the user in the second audio input. The computing device may store the measured speech characteristics. The computing device may determine, based at least in part on a comparison between a third audio input data and the stored speech characteristics, that the user may be speaking. Responsive to the computing device determining that the third audio input data may include speech associated with the user, the computing device may determine, based at least in part on the third audio input data, whether to output third audio data. Responsive to determining to output the third audio data, the computing device may determine a third volume level lower than the first volume level. The computing device may output, for playback at the third volume level by the audio output device, the third audio data.

EXAMPLE 1

A method comprising: outputting, by a computing device associated with a user and for playback at a first volume level by an audio output device, first audio data; receiving, by the computing device, audio input data; responsive to determining, by the computing device, that the audio input data includes speech associated with an entity different from the user, determining, by the computing device and based at least in part on the audio input data, whether to output second audio data; and responsive to determining to output the second audio data: determining, by the computing device, a second volume level lower than the first volume level; and outputting, by the computing device and for playback at the second volume level by the audio output device, the second audio data.

EXAMPLE 2

The method of example 1, wherein the audio input data is first audio input data, the method further comprising:

responsive to determining, by the computing device and based at least in part on a comparison between second audio input data and stored speech characteristics of the user, that the user is speaking, determining, by the computing device and based at least in part on the second audio input data, whether to output third audio data; and responsive to determining to output the third audio data: determining, by the computing device, a third volume level lower than the first volume level; and outputting, by the computing device and for playback at the third volume level by the audio output device, the third audio data.

EXAMPLE 3

The method of any of examples 1-2, further comprising, responsive to determining, by the computing device, that the audio input includes speech associated with an entity different from the user: receiving, by the computing device, second audio input data, wherein the second audio input data is speech associated with the user; measuring, by the computing device, speech characteristics of the user in the second audio input; and storing, by the computing device, the measured speech characteristics.

EXAMPLE 4

The method of any of examples 1-3, further comprising, responsive to the computing device detecting that speech associated with the entity different from the user has ended, outputting, by the computing device and for playback at the first volume level by the audio output device, third audio data.

EXAMPLE 5

The method of any of examples 1-4, further comprising, responsive to receiving an indication of user input, outputting, by the computing device and for playback at the first volume level by the audio output device, third audio data.

EXAMPLE 6

The method of any of examples 1-5, wherein a volume level of the audio input data satisfies a threshold volume level.

EXAMPLE 7

The method of any of examples 1-6, further comprising: determining, by the computing device and based on the audio input, that a conversation is occurring between the user and the entity different from the user.

EXAMPLE 8

The method of any of examples 1-7, further comprising: receiving, by the computing device, additional audio data; determining, by the computing device and based on the additional audio data, that the conversation has ended; outputting, by the computing device and for playback at the first volume level by the audio output device, third audio data.

EXAMPLE 9

The method of any of examples 1-8, wherein determining that the audio input data includes speech associated with the entity different from the user comprises determining that the audio input data includes a conversational keyword.

EXAMPLE 10

The method of any of examples 1-9, further comprising: determining, by the computing device, a direction from which the audio input data is originating from; determining, by the computing device, a direction that the computing device is facing; and comparing, by the computing device, the direction from which the audio input data is originating from to the direction that the computing device is facing to determine if the computing device is facing an origin point for the audio input data.

EXAMPLE 11

The method of example 10, further comprising: in response to determining that the computing device is facing the origin point for the audio input data, receiving, by the computing device, second audio input data; and determining, by the computing device, whether the second audio input data contains speech associated with the user.

EXAMPLE 12

A computing system associated with a user, comprising: one or more processors; an audio output device that outputs, at a first volume level, first audio data; an audio input device that receives audio input data; and one or more modules operable by the one or more processors to, responsive to determining that the audio input data includes speech associated with an entity different from the user, determine whether to output second audio data, and, responsive to determining to output the second audio data, determine a second volume level lower than the first volume level, wherein the audio output device is further configured to output, at the second volume level, the second audio data.

EXAMPLE 13

The computing system of example 12, wherein the audio input data is first audio input data and the one or more modules are further operable by one or more processors to: responsive to determining, based at least in part on a comparison between second audio input data and stored speech characteristics of the user, that the user is speaking, determine, based at least in part on the second audio input data, whether to output third audio data; and responsive to determining to output the third audio data, determine a third volume level lower than the first volume level, wherein the audio output device is further configured to output, at the third volume level, the third audio data.

EXAMPLE 14

The computing system of any of examples 12-13, wherein the one or more modules are further operable by one or more processors to: responsive to determining, by the computing device, that the audio input includes speech associated with an entity different from the user: receive second audio input data, wherein the second audio input data is speech associated with the user; and measure speech characteristics of the user in the second audio input; and wherein the computing system further comprises a data storage unit configured to store the measured speech characteristics.

EXAMPLE 15

The computing system of any of examples 12-14, wherein the one or more modules are further operable by one or more processors to: determine, based on the audio input, that a conversation is occurring between the user and the entity different from the user.

EXAMPLE 16

The computing system of any of examples 12-15, wherein the one or more modules are further operable by one or more processors to: receive additional audio data; and determine, based on the additional audio data, that the conversation has ended, wherein the audio output device is further configured to output, at the first volume level, third audio data.

EXAMPLE 17

The computing system of any of examples 12-16, wherein determining that the audio input data includes speech associated with the entity different from the user comprises determining that the audio input data includes a conversational keyword.

EXAMPLE 18

The computing system of any of examples 12-17, wherein the computing system is a wearable computing system.

EXAMPLE 19

The computing system of any of examples 12-18, wherein the one or more modules are further operable by one or more processors to: determine a direction from which the audio input data is originating from; determine a direction that the computing device is facing; and compare the direction from which the audio input data is originating from to the direction that the computing device is facing to determine if the computing device is facing an origin point for the audio input data.

EXAMPLE 20

The computing system of example 19, wherein the one or more modules are further operable by one or more processors to: in response to determining that the computing device is facing the origin point for the audio input data, receive second audio input data; and determine whether the second audio input data contains speech associated with the user.

EXAMPLE 21

A computer-readable storage medium encoded with instructions that, when executed, cause at least one processor of a computing device associated with a user to: output, for playback at a first volume level by an audio output device, first audio data; receive audio input data; responsive to determining that the audio input data includes speech associated with an entity different from the user, determine, based at least in part on the audio input data, whether to output second audio data; and responsive to determining to output the second audio data: determine a second volume level lower than the first volume level; and output, for playback at the second volume level by the audio output device, the second audio data.

EXAMPLE 22

The computer-readable storage medium of example 21, wherein the audio input data is first audio input data and wherein the instructions, when executed, further cause the at least one processor to: responsive to determining, based at least in part on a comparison between second audio input data and stored speech characteristics of the user, that the user is speaking, determine, based at least in part on the second audio input data, whether to output third audio data; and responsive to determining to output the third audio data: determine a third volume level lower than the first volume level; and output, for playback at the third volume level by the audio output device, the third audio data.

EXAMPLE 23

The computer-readable storage medium of any of examples 21-22, wherein the instructions, when executed, further cause the at least one processor to: responsive to determining that the audio input includes speech associated with an entity different from the user: receive second audio input data, wherein the second audio input data is speech associated with the user; measure speech characteristics of the user in the second audio input; and store the measured speech characteristics.

EXAMPLE 24

The computer-readable storage medium of any of examples 21-23, wherein the instructions, when executed, further cause the at least one processor to: determine, based on the audio input, that a conversation is occurring between the user and the entity different from the user.

EXAMPLE 25

The computer-readable storage medium of any of examples 21-24, wherein the instructions, when executed, further cause the at least one processor to: receive additional audio data; determine, based on the additional audio data, that the conversation has ended; and output, for playback at the first volume level by the audio output device, third audio data.

EXAMPLE 26

The computer-readable storage medium of any of examples 21-25, wherein determining that the audio input data includes speech associated with the entity different from the user comprises determining that the audio input data includes a conversational keyword.

EXAMPLE 27

The computer-readable storage medium of any of examples 21-26, wherein the instructions, when executed, further cause the at least one processor to: determine a direction from which the audio input data is originating from; determine a direction that the computing device is facing; and compare the direction from which the audio input data is originating from to the direction that the computing device is facing to determine if the computing device is facing an origin point for the audio input data.

EXAMPLE 28

The computer-readable storage medium of example 27, wherein the instructions, when executed, further cause the at least one processor to: in response to determining that the computing device is facing the origin point for the audio input data, receive second audio input data; and determine whether the second audio input data contains speech associated with the user.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that may be accessed by one or more computers or one or more processors to retrieve instructions, code and/or data structures for implementation of the techniques described in this disclosure. A computer program product may include a computer-readable medium.

By way of example, and not limitation, such computer-readable storage media may comprise RAM, ROM, EEPROM, CD-ROM or other optical disk storage, magnetic disk storage, or other magnetic storage devices, flash memory, or any other medium that may be used to store desired program code in the form of instructions or data structures and that may be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used may refer to any of the foregoing structure or any other structure suitable for implementation of the techniques described. In addition, in some aspects, the functionality described may be provided within dedicated hardware and/or software modules. Also, the techniques may be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

It is to be recognized that depending on the embodiment, certain acts or events of any of the methods described herein may be performed in a different sequence, may be added, merged, or left out all together (e.g., not all described acts or events are necessary for the practice of the method). Moreover, in certain embodiments, acts or events may be performed concurrently, e.g., through multi-threaded processing, interrupt processing, or multiple processors, rather than sequentially.

Throughout this disclosure, examples are described in which a computing device and/or a computing system may access and/or analyze information (e.g., executing applications, locations, speeds, calendars, communications, audio data, etc.) associated with a computing device only if the computing device receives permission from a user to do so. For example, in situations discussed below in which the computing device may collect or may make use of contextual information associated with a user and/or contextual information associated with the computing device, the user may be provided with an opportunity to provide input to control whether programs or features of the computing device can collect and make use of such information, or to dictate whether and/or how long the computing device may store such information. In addition, if allowed to collect any data, the computing device may treat certain data in one or more ways before the data is stored or used by the computing device and/or a computing system, so that personally-identifiable information is removed. For example, after obtaining location information for the computing device, the geographic location may be generalized (such as to a city, ZIP code, or state level), so that a particular location of the computing device or user cannot be determined. Thus, the user may have control over how information is collected about the user and how information is used by the computing device.

Various examples have been described. These and other examples are within the scope of the following claims.

The invention claimed is:
1. A method comprising:
   outputting, by a computing device associated with a user, for playback by an audio output device at a first volume level, first audio output data;
   receiving, by the computing device, audio input data;
   responsive to determining, by the computing device, that the audio input data includes speech associated with an entity different from the user and that the speech includes a conversational keyword, determining, by the computing device and based at least in part on the audio input data, whether to output second audio output data; and
   responsive to determining to output the second audio output data:
      determining, by the computing device, a second volume level lower than the first volume level; and
      outputting, by the computing device, for playback by the audio output device at the second volume level, the second audio output data.
2. The method of claim 1, wherein the audio input data is first audio input data, the method further comprising:

responsive to determining, by the computing device and based at least in part on a comparison between second audio input data and stored speech characteristics of the user, that the second audio input data was received from the user, determining, by the computing device and based at least in part on the second audio input data, whether to output third audio output data; and responsive to determining to output the third audio output data:

determining, by the computing device, a third volume level lower than the first volume level; and outputting, by the computing device and for playback at the third volume level by the audio output device, the third audio output data.

3. The method of claim 2, further comprising, responsive to determining, by the computing device, that the audio input includes speech associated with an entity different from the user:

receiving, by the computing device, second audio input data, wherein the second audio input data is speech associated with the user;

measuring, by the computing device, speech characteristics of the user in the second audio input; and storing, by the computing device, the measured speech characteristics.

4. The method of claim 1, further comprising, responsive to receiving an indication of user input, outputting, by the computing device and for playback by the audio output device at the first volume level, third audio output data.

5. The method of claim 1, wherein a volume level of the audio input data satisfies a threshold volume level.

6. The method of claim 1, further comprising:

determining, by the computing device and based on the audio input that includes the speech associated with the entity different than the user and that includes the conversational keyword, that a conversation is occurring between the user and the entity different from the user;

receiving, by the computing device, additional audio output data;

determining, by the computing device and based on the additional audio output data, that the conversation has ended; and outputting, by the computing device and for playback by the audio output device at the first volume level, third audio output data.

7. The method of claim 1, further comprising:

determining, by the computing device, a direction from which the audio input data is originating from;

determining, by the computing device, a direction that the computing device is facing; and comparing, by the computing device, the direction from which the audio input data is originating from to the direction that the computing device is facing to determine if the computing device is facing an origin point for the audio input data.

8. The method of claim 7, further comprising:

receiving, by the computing device, second audio input data; and responsive to determining that the computing device is facing the origin point for the audio input data, determining, by the computing device, whether the second audio input data contains speech associated with the user; or responsive to determining that the computing device is not facing the origin point for the audio input data, refraining from determining, by the computing device, whether the second audio input data contains speech associated with the user.

9. The method of claim 1, wherein the conversational keyword comprises one of a name associated with the user, a nickname associated with the user, or a salutation.

10. A computing system associated with a user, comprising:

one or more processors;

an audio output device that outputs, at a first volume level, first audio output data;

an audio input device that receives audio input data; and one or more modules operable by the one or more processors to, responsive to determining that the audio input data includes speech associated with an entity different from the user and that the speech includes a conversational keyword, determine whether to output second audio output data, and, responsive to determining to output the second audio output data, determine a second volume level lower than the first volume level, wherein the audio output device is further configured to output, at the second volume level, the second audio output data.

11. The computing system of claim 10, wherein the audio input data is first audio input data and the one or more modules are further operable by one or more processors to:

responsive to determining, based at least in part on a comparison between second audio input data and stored speech characteristics of the user, that the second audio input data was received from the user, determine, based at least in part on the second audio input data, whether to output third audio output data;

responsive to determining to output the third audio output data, determine a third volume level lower than the first volume level, wherein the audio output device is further configured to output, at the third volume level, the third audio output data; and responsive to determining that the audio input includes speech associated with an entity different from the user:

receive second audio input data, wherein the second audio input data is speech associated with the user; and measure speech characteristics of the user in the second audio input; and wherein the computing system further comprises a data storage unit configured to store the measured speech characteristics.

12. The computing system of claim 10, wherein the one or more modules are further operable by one or more processors to:

determine, based on the audio input that includes the speech associated with the entity different than the user and that includes the conversational keyword, that a conversation is occurring between the user and the entity different from the user;

receive additional audio output data;

determine, based on the additional audio output data, that the conversation has ended; and output, for playback by the audio output device at the first volume level, third audio output data.

13. The computing system of claim 10, wherein the computing system is a wearable computing system.

14. The computing system of claim 10, wherein the audio input device is further configured to receive second audio input data, and wherein the one or more modules are further operable by one or more processors to:

determine a direction from which the audio input data is originating from;
determine a direction that the computing system is facing;
compare the direction from which the audio input data is originating from to the direction that the computing system is facing to determine if the computing system is facing an origin point for the audio input data; and
responsive to determining that the computing system is facing the origin point for the audio input data, determine whether the second audio input data contains speech associated with the user; or
responsive to determining that the computing device is not facing the origin point for the audio input data, refrain from determining whether the second audio input data contains speech associated with the user.

15. The computing system of claim 10, wherein the conversational keyword comprises one of a name associated with the user, a nickname associated with the user, or a salutation.

16. A non-transitory computer-readable storage medium encoded with instructions that, when executed, cause at least one processor of a computing device associated with a user to:
output, for playback by an audio output device at a first volume level, first audio output data;
receive audio input data;
responsive to determining that the audio input data includes speech associated with an entity different from the user and that the speech includes a conversational keyword, determine, based at least in part on the audio input data, whether to output second audio output data; and
responsive to determining to output the second audio output data:
determine a second volume level lower than the first volume level; and
output, for playback by the audio output device at the second volume level, the second audio output data.

17. The non-transitory computer-readable storage medium of claim 16, wherein the audio input data is first audio input data and wherein the instructions, when executed, further cause the at least one processor to:
responsive to determining, based at least in part on a comparison between second audio input data and stored speech characteristics of the user, that the user is speaking, determine, based at least in part on the second audio input data, whether to output third audio output data;
responsive to determining to output the third audio output data:
determine a third volume level lower than the first volume level; and
output, for playback by the audio output device at the third volume level, the third audio output data; and
responsive to determining that the audio input includes speech associated with an entity different from the user:
receive second audio input data, wherein the second audio input data is speech associated with the user;
measure speech characteristics of the user in the second audio input; and
store the measured speech characteristics.

18. The non-transitory computer-readable storage medium of claim 16, wherein the instructions, when executed, further cause the at least one processor to:
determine, based on the audio input that includes the speech associated with the entity different than the user and that includes the conversational keyword, that a conversation is occurring between the user and the entity different from the user;
receive additional audio output data;
determine, based on the additional audio output data, that the conversation has ended; and
output, for playback by the audio output device at the first volume level, third audio output data.

19. The non-transitory computer-readable storage medium of claim 16, wherein the instructions, when executed, further cause the at least one processor to:
determine a direction from which the audio input data is originating from;
determine a direction that the computing device is facing;
compare the direction from which the audio input data is originating from to the direction that the computing device is facing to determine if the computing device is facing an origin point for the audio input data;
receive second audio input data; and
responsive to determining that the computing device is facing the origin point for the audio input data, determine whether the second audio input data contains speech associated with the user; or
responsive to determining that the computing device is not facing the origin point for the audio input data, refrain from determining whether the second audio input data contains speech associated with the user.

20. The non-transitory computer-readable storage medium of claim 16, wherein the conversational keyword comprises one of a name associated with the user, a nickname associated with the user, or a salutation.

* * * * *